Figure 1:
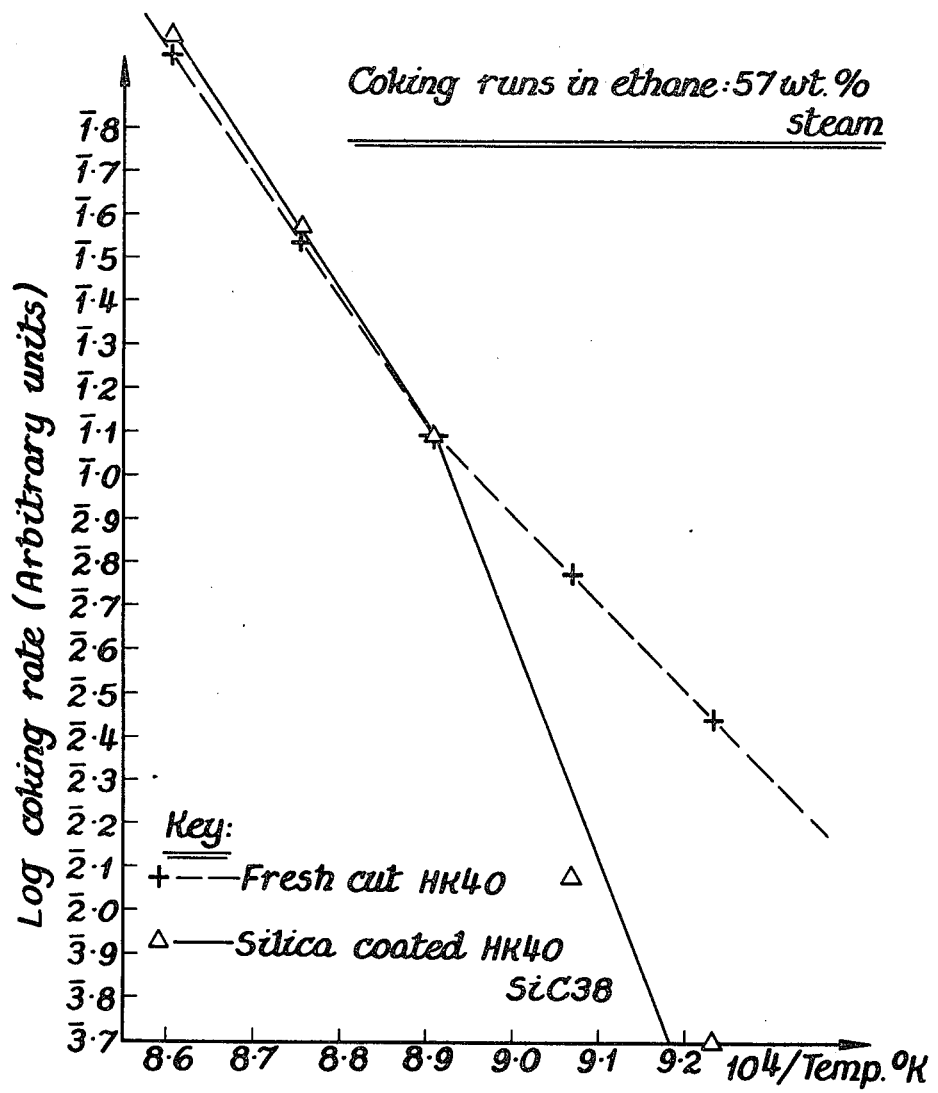

United States Patent [19]

Brown et al.

[11] 4,099,990
[45] Jul. 11, 1978

[54] METHOD OF APPLYING A LAYER OF SILICA ON A SUBSTRATE

[75] Inventors: David Emmerson Brown; John Trevor Kent Clark, both of Weybridge; John James McCarroll, Camberley; Malcolm Leslie Sims, Walton-on-Thames, all of England

[73] Assignee: The British Petroleum Company Limited, London, England

[21] Appl. No.: 669,636

[22] Filed: Mar. 23, 1976

[30] Foreign Application Priority Data

Apr. 7, 1975 [GB] United Kingdom ............... 14145/75

[51] Int. Cl.$^2$ ............................................. C23C 11/10
[52] U.S. Cl. ............................. 148/6.35; 427/248 A; 427/248 H; 427/315; 427/318; 427/376 D; 428/450
[58] Field of Search ............... 427/95, 248 R, 248 H, 427/248 A, 315, 318, 376 D, 387, 226; 428/450, 457; 148/6.35

[56] References Cited

U.S. PATENT DOCUMENTS

| 3,003,857 | 10/1961 | Carls | 44/58 |
|---|---|---|---|
| 3,013,897 | 12/1961 | Cupery et al. | 428/450 |
| 3,013,898 | 12/1961 | Dempcy | 427/318 |
| 3,150,015 | 9/1964 | Boyer et al. | 427/376 |
| 3,170,865 | 2/1965 | Allen et al. | 208/48 |
| 3,445,280 | 5/1969 | Tokuyama et al. | 427/95 |
| 3,532,539 | 10/1970 | Tokuyama et al. | 427/95 |
| 3,556,841 | 1/1971 | Iwasa et al. | 427/95 |
| 3,607,378 | 9/1971 | Ruggiero | 427/95 |
| 3,934,060 | 1/1976 | Burt et al. | 427/248 |

FOREIGN PATENT DOCUMENTS

| 812,249 | 5/1969 | Canada | 427/226 |
|---|---|---|---|
| 6,907,435 | 7/1969 | Netherlands | 427/226 |
| 1,332,569 | 10/1973 | United Kingdom | 427/226 |

*Primary Examiner*—Ronald H. Smith
*Assistant Examiner*—Sadie L. Childs
*Attorney, Agent, or Firm*—Brooks, Haidt, Haffner & Delahunty

[57] ABSTRACT

Substrate surfaces are rendered resistant to coking by vaporizing an alkoxysilane in contact with the surface to form a protective layer of silica thereon.

9 Claims, 1 Drawing Figure

METHOD OF APPLYING A LAYER OF SILICA ON A SUBSTRATE

The present invention relates to a process for forming protective surface films on the inner surface of reactor tubes and coils.

Tubes and coils used in high temperature reaction systems involving carbonaceous material e.g. hydrocarbon conversion reactions by thermal cracking are prone to coking and carburisation. Such reactions are frequently used not only to obtain olefins, particularly ethylene by cracking, and motor fuels from petroleum sources by conversion of heavy feedstocks but also to obtain products such as vinyl chloride from dichloroethane. Inevitably, such reactions are accompanied by coke formation inside the cracking tubes, resulting in a restricted flow of the reaction material and reduced heat transfer from the tube metal to the process gas. This necessitates raising the tube metal temperature to maintain a constant gas temperature and production rate. The tube metal temperature therefore increases as coke formation progresses and this is a limiting factor for reactor on-stream time-efficiency. When the coil metal temperature reaches the maximum allowable value for safe operation it is taken off-stream for de-coking with consequent loss of production. Coke formation also causes damage to the inner surface of the tube owing to carburisation and frequent exposure to the carburisation/oxidation cycle also accelerates corrosion, both of which reduce reactor life expectancy.

Conventional methods used to reduce coke formation and carburisation in steam-cracking coils involve steam pre-treatment of the surface to promote formation of a protective oxide skin. Steam dilution of the hydrocarbon vapours has also been used to reduce the level of homogeneous coking. Also, sulphur compounds are added to the process gases to poison active nickel sites and so inhibit steam reforming metal-dusting corrosion. However, the coke formation rate (CFR) is still rapid under high severity conditions, and run lengths of about 30 days have been accepted as the norm.

It is, therefore, an object of the present invention to subject such tubes to treatment so as to increase their carburisation resistance and reduce their tendency to catalyse coke formation, thereby increasing furnace on-stream run lengths and the life expectancy of the coil.

It has now been found that the reduction in coke formation may be achieved by the formation of chemically inert and highly refractory surface films of silica on the substrate surface, such films reducing the surface catalytic activity of said surfaces.

Accordingly, the present invention is a process for forming protective films on a substrate surface suspectible to coke formation comprising depositing on the substrate surface a layer of silica by thermal decomposition of an alkoxy silane in the vapour phase in contact with the substrate surface.

The process is suitable for protecting surfaces of metals such as mild steel, high alloy steel and low alloy steel; and especially for alloys used in construction of reactors for high temperature hydrocarbon conversion reactions such as during the production of ethylene by cracking, gas turbine compressors used in oxidising, reducing or marine environments, advanced gas-cooled reactor exchanger surfaces and for reactor tubes such as those used in the production of vinyl chloride from dichloroethane. Such alloys usually contain nickel, chromium or iron. Suitable examples of alloys which may be subjected to treatment according to the process of the present invention include high alloy steels such as Inconel (Registered Trade Mark), Incoloy (Registered Trade Mark) and AISI310/HK 40 grade materials. Other lower grade "stainless" steels such as type 321, 304 and 316 alloys may also benefit by such treatment.

The alkoxy silanes which may be used to deposit the layer of silica on the substrate surface are suitably mono-, di-, tri- or tetra-alkoxy silanes and the partially hydrolysed or polymerised products thereof. These contain preferably between 1 and 15 carbon atoms in the alkoxy group. Of these tetra-alkoxy silanes are most suitable and tetra-ethoxy silane is most preferable.

In order to maximise the efficiency of the alkoxy silane deployed for depositing the silica layer on the substrate surface, it is preferable to vapourise the alkoxy silane into a carrier gas stream, e.g. gases such as nitrogen, helium and argon which are inert under the reaction conditions, or, oxygenated gases such as carbon dioxide, steam, nitrogen oxides and oxides of sulphur which are mildly oxidising under the reaction conditions. The carrier gas stream may be a mixture of the inert and mildly oxidising gases. The best mixture will depend on operational constraints, the required rate of coating formation and degree of consumption of the alkoxy silane desired.

The amount of alkoxy silane required for the formation of the layer of silica would depend upon the nature of the substrate and the thickness of the layer required. The concentration of alkoxy silane in the carrier gas is suitably less than 10.0% v/v, preferably between 0.05 and 1.5% v/v.

The temperature at which the deposition is carried out may be between 200° and 1200° C, but it is preferable to carry out the deposition between 600° and 900° C. The deposition is preferably carried out at atmospheric pressure.

Where a mildly oxidising gas such as $CO_2$ or steam is used as a carrier gas component, the amount of the oxidising gas required for the deposition may vary between a wide range depending upon the nature of the substrate. It is suitably between 5 and 100% and preferably between 30 and 100% by volume of total carrier gas stream.

In certain cases it may be desirable to preoxidise the substrate surface prior to treatment with an alkoxy silane. This may be achieved by using a gas/$O_2$ flame for a few minutes followed by heating at high temperature, e.g. 800° C, in the presence of steam. This preliminary step is designed to give an adherent matt-black oxide surface which is similar in appearance and composition to the inner surface of furnace tubes. Such treatment is unlikely to be necessary in a plant because it is thought that the adherent oxide film will have already been formed. In general if it is felt necessary to carry out an oxidative pre-treatment of the surface, this may be achieved by any combination oxidation treatments, such as flaming or heating in an oxidising atmosphere such as $CO_2$ or $H_2O$ to provide thin, adherent oxide films.

The effectiveness of this treatment on cracker tube is demonstrated by the coke formation rate (CFR) shown in the FIGURE.

The invention is further illustrated with reference to the following Examples.

EXAMPLE 1

(a) Procedure for Silica Coating

A sample of fresh cut HK 40 grade stainless steel was preoxidised using a gas/oxygen flame for 2 minutes and placed in a silica vessel. This was followed up by treatment at 800° C in 75% steam (with nitrogen as inert diluent) for several hours. This gave a matt-black oxide surface similar to that of furnace tubes. This preoxidised metal was then heated in flowing steam (50%) and tetraethoxy silane (0.5%), $N_2$ balance, at 740° C for 4.5 hr. The coated sample was thereafter allowed to cool to ambient temperature leaving a silica layer of 2 μm thickness on the metal surface.

(b) Procedure for determining the Coke Formation Rate

The silica coated metal as described was mounted in a chamber and the temperature raised to 900° C in an atmosphere of nitrogen (60 ml/min). At that temperature ethane (57 ml/min) was injected together with steam (124 ml/min), and the coking rate followed on an automatic microbalance. After 1 hour the temperature was dropped and rates determined at 860°, 880° and so on up to 980° at 0.5–1 hr. intervals. The procedure was repeated using untreated HK40. The results are plotted in FIG. 1.

EXAMPLE 2

Example 1 was repeated using ethane (57 ml/min) and steam (249.0 ml/min).

The results were similar to that in FIG. 1 for Example 1.

EXAMPLE 3

Example 2 was repeated using an additional heavier feed which was hexane (34.4 ml/min).

The results obtained were the same as before with the measured rates being very similar.

From the results it is clear that the coking rate on silica coated steel is between 2 and 8 times slower than on steel itself within the temperature range now of interest.

Despite rapid cool down to ambient from 740° C heating to 980° C in coking tests and at a second rapid cooling to ambient, the scanning electron microscope investigations show no detachment of the coating.

EXAMPLE 4

A 7½ turn 5-meter coil of Incoloy 800 (⅜ inch OD 20 swg) tubing was pretreated at 740°–760° C for 30 minutes in 2 liters/sec of steam (vapour at 750° C). The tube was then coated by injecting 0.26%v/v tetraethoxysilane into the steam for 25 minutes. Samples were cut from the tubing walls at intervals from the inlet to the exit with areas at points close to and away from the furnace walls. The film on the tube was of uniform thickness (circa 2 μm), with the appearance of coalescing (or overcrowded) balls. Variations in the diameter of the balls were observed but had no effect on the film continuity.

EXAMPLE 5

Incoloy 800 (⅜ inch OD 20 swg) tubing was pretreated in $CO_2$ for 1.4 hours at 680°–760° C flowing at 36.1 liter/min (42.2 m/sec). Tetraethoxysilane 0.7 wt. % was injected into the carbon dioxide and the treatment was continued for 40 minutes with the tube being maintained between 680°–760° C. After this time the tube was cooled in flowing carbon dioxide and a portion removed for examination. Scanning electron microscopy of the film produced showed the overcrowded ball structure of previous films with no cracks resulting from failure.

EXAMPLES 6–8

Examples 6–8 were carried out in a manner similar to Example 5 with minor variations in flow rate, etc. These variations and the results obtained are tabulated below.

| Ex. | Treatment ++ | Flow Rate l/min (reaction velocity m/s) *+ | Tetraethoxy Silane injection rate ml/h | (vol. %) wt./ | Temp °C |
|---|---|---|---|---|---|
| 6 | 1 h $CO_2$ pretreatment + $SiO_2$ coating (6 mins 6ml) | 83.54 (97.71) | 60.1 | (0.14)0.66 | 620–768 |
| 7 | 1 h $CO_2$ pretreatment + $SiO_2$ coating (24 mins, 24 ml) | 83.54 (97.71) | 60.1 | (0.14)0.66 | 690–760 |
| 8 | 1 h $CO_2$ pretreatment while reducing flow rate from 84–54 l/min+$SiO_2$ coating (12 mins, 6 ml) | 53.82 (62.95) | 30.0 | (0.10)0.47 | 670–770 |

++All $SiO_2$ coatings at 750° C
*Tube ID 7.6 mm Cross-Section = 0.454 cm²
+ *Velocity allows for expansion at reaction temperature shown*

The process of the present invention is clearly beneficial to substrate surfaces susceptible to coking. It is, however, expected that such treatment could be beneficial to other surfaces such as those susceptible to sulphur induced corrosion or high temperature oxidation.

We claim:

1. A process for forming protective films on a nickel, chromium or iron alloy substrate surface susceptible to coke formation, comprising first preoxidizing said surface at an elevated temperature and then depositing on said preoxidized substrate surface a layer of silica by thermally decomposing an alkoxy silane vapor in a carrier gas in contact with the preoxidized substrate surface.

2. A process as defined in claim 1 wherein said substrate surface is preoxidized at elevated temperatures in an oxidizing atmosphere of carbon dioxide or steam.

3. A process according to claim 1 wherein the alkoxy silane is selected from mono-, di-, tri- and tetra alkoxysilane and the partially hydrolysed or polymerised products thereof.

4. A process according to claim 3 wherein the alkoxy silane is tetraethoxysilane.

5. A process according to claim 1 wherein the alkoxysilane is vapourised into a carrier gas stream selected from carbon dioxide, steam, nitrogen, helium and argon.

6. A process according to claim 5 wherein the concentration of the alkoxysilane in the carrier gas is less than 10% by volume.

7. A process according to claim 5 wherein the concentration of the alkoxysilane in the carrier gas is between 0.05 and 1.5% by volume.

8. A process according to claim 1 wherein the silica layer is deposited on the substrate surface at a temperature between 200° and 1200° C.

9. A process according to claim 1 wherein the silica layer is deposited on the substrate surface at a temperature between 600° and 900° C.

* * * * *